United States Patent
Zhou et al.

(10) Patent No.: US 8,793,551 B2
(45) Date of Patent: Jul. 29, 2014

(54) SERIAL CONCATENATION OF TRELLIS CODED MODULATION AND AN INNER NON-BINARY LDPC CODE

(75) Inventors: Wei Zhou, Beijing (CN); Li Zou, Shanghai (CN); Yuping Zhao, Beijing (CN); Xiaoxin Zhang, Beijing (CN)

(73) Assignee: Thomson Licensing, Boulogne-Billancourt (FR)

( * ) Notice: Subject to any disclaimer, the term of this patent is extended or adjusted under 35 U.S.C. 154(b) by 567 days.

(21) Appl. No.: 12/737,107

(22) PCT Filed: Jun. 24, 2009

(86) PCT No.: PCT/IB2009/006041
§ 371 (c)(1),
(2), (4) Date: Dec. 8, 2010

(87) PCT Pub. No.: WO2009/156828
PCT Pub. Date: Dec. 30, 2009

(65) Prior Publication Data
US 2011/0078533 A1 Mar. 31, 2011

(30) Foreign Application Priority Data
Jun. 25, 2008 (EP) .................................. 08305322

(51) Int. Cl.
*H03M 13/00* (2006.01)
(52) U.S. Cl.
USPC ........................................................ 714/752
(58) Field of Classification Search
None
See application file for complete search history.

(56) References Cited

U.S. PATENT DOCUMENTS

| | | | |
|---|---|---|---|
| 7,322,005 B2 | 1/2008 | Shen et al. | |
| 2002/0034269 A1 * | 3/2002 | Demjanenko et al. | 375/341 |
| 2002/0090035 A1 | 7/2002 | Seshadri et al. | |
| 2004/0086059 A1 * | 5/2004 | Eroz et al. | 375/298 |
| 2004/0202255 A1 * | 10/2004 | Dallal | 375/267 |
| 2005/0216819 A1 * | 9/2005 | Chugg et al. | 714/786 |
| 2006/0031737 A1 * | 2/2006 | Chugg et al. | 714/755 |
| 2006/0092902 A1 * | 5/2006 | Schmidt | 370/342 |
| 2006/0236197 A1 | 10/2006 | Lin et al. | |
| 2008/0175331 A1 * | 7/2008 | Kroeger | 375/261 |
| 2011/0029845 A1 * | 2/2011 | Zhou et al. | 714/776 |

FOREIGN PATENT DOCUMENTS

| | | |
|---|---|---|
| EP | 0641087 | 1/1995 |
| JP | 7170300 | 7/1995 |
| JP | 2002135134 A2 | 5/2002 |
| JP | 2003198385 | 7/2003 |
| WO | 2006076527 A2 | 7/2006 |

OTHER PUBLICATIONS

Li et al., "Good LDPC Codes Over GF(Q) for Bandwidth Efficient Transmission", Advanes in Wireless Communications, 2003 4th IEEE Workshop on Signal Processing, 2003.
Davey et al., "Low-Density Parity Check Codes over GF(q)", IEEE Communications Letters, vol. 2, No. 6, Jun. 1998.

(Continued)

*Primary Examiner* — Gabriel Chu
(74) *Attorney, Agent, or Firm* — Robert D. Shedd; Jerome G. Schaefer

(57) ABSTRACT

A concatenated coded modulation communication system and method combines Trellis Coded Modulation with non-Gray code constellation mapping, interleaving, and non-binary Low Density Parity Check coded channel modulation with Gray code constellation mapping to improve error performance.

14 Claims, 4 Drawing Sheets

Flow Chart according to the Invention

(56) References Cited

OTHER PUBLICATIONS

Tan et al., "Analysis and Design of Symbol Mappers for Iteratively Decoded BICM", IEEE Transactions on Wireless Communications, vol. 4, No. 5, Mar. 2005.

Ng T al., "A Turbo-Detection Aided Serially Concatenated MPEG-4/TCM Videophone Transceiver", University of Southampton, UK, 2004.

Rui et al., "Performance of Belief Propagation Coded Modulation with Iterative Decoding", 2004, IEEE, Nangjing, China.

Tuchler et al., Design of Serially Concatenated Systems for Long or Short Block Lengths, Munich University of Technology, Germany, 2003.

Tullberg et al., Serial Concatenated Trellis Coded Modulation with Inner Rate-1 Accumulae Code, University of California, San Diego, CA 2001.

Divsalar et al., "Serial Concatenated Trellis Coded Modulation with Rate-1 Inner Code", IEEE, California, 2000.

Search Report Dated: Oct. 14, 2009.

Pons et al., "Enhanced TCM based on a multilevel Hierarchical Trellis Coded Modulation (HTCM)" IEEE Communications Society, Globecome 2004 pp. 25892593.

Viterbi, "Interleaved concatenated codes: New perspectives on approaching the Shannon limit"1997 by the National Academy of Sciences, vol. 94, pp. 9525-9531, Sep. 1997.

Peng, "Application of Nonbinary LDPC Codes for Communication_over_Fading Channels Using Higher Order Modulations", Department of Electrical and Computer Engineering, University of Utah, Salt Lake City, UT 84112 2006 IEEE.

Robertson, "Bandwidth-Efficient Turbo Trellis-Coded Modulation Using Punctured Component Codes", IEEE Journal on Selected Areas in Communcations, vol. 16, No. 2, Feb. 1998.

Zou, Optimized Rotations and labeling for non-binary LDPC coded modulation with Signal Space Diversity, Broadband Multimedia Systems and Broadcasting 2009, IEEE International Symposium 2008, May 13-15, 2009, pp. 1-4, May 12, 2009.

Chen, "A Stopping Criterion for Nonbinary LDPC Codes Over GF(q)", Communications Systems 2008, 11th IEEE Singapore International Conference, Nov. 19-21, 2008 pp. 1312-1315—Nov. 19, 2008.

Declereq et al., "Regular GF(2q)-LDPC Modulations for higher order QAM-AWGN channels" International Symposium on Information Theory and its Applications, ISITA 2004, Parma, Italy Oct. 10-13, 2004.

\* cited by examiner

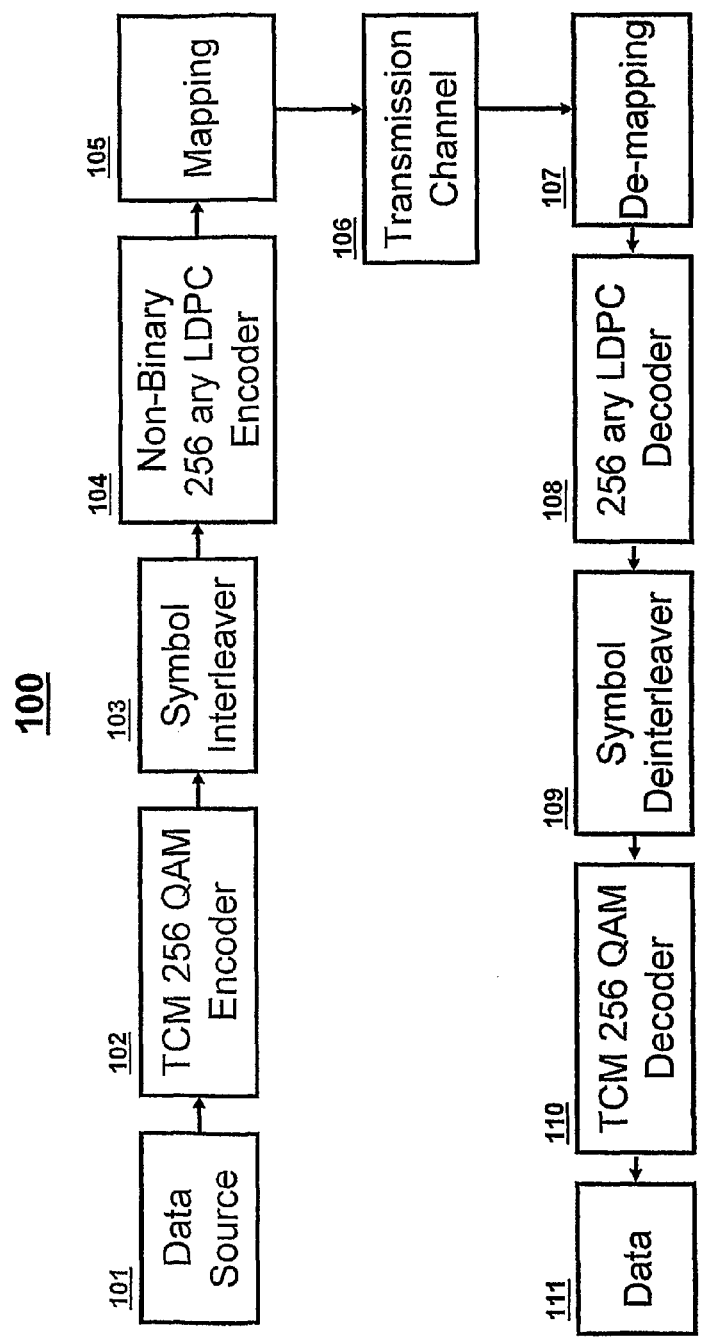
Figure 1. Block Diagram according to the invention

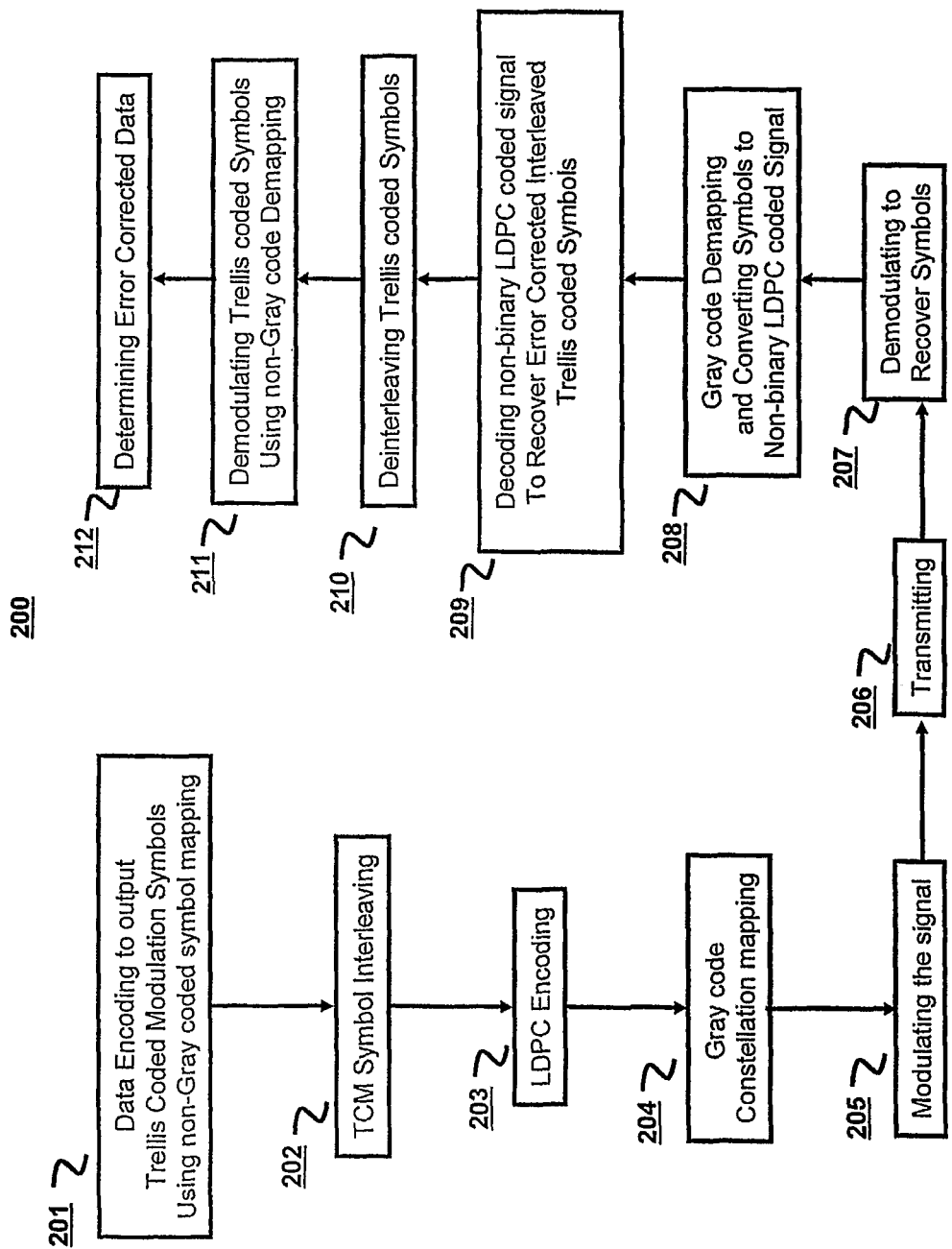
Figure 1a. Flow Chart according to the Invention

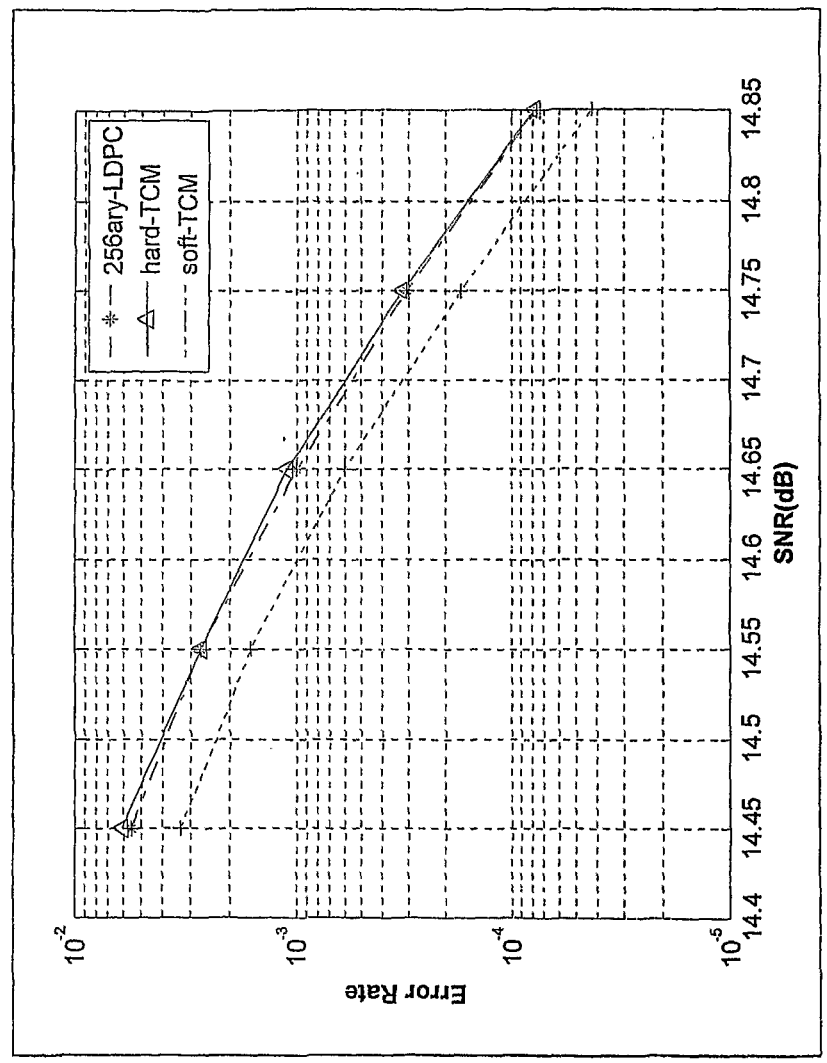
Figure 2. Exemplary performance using hybrid criteria

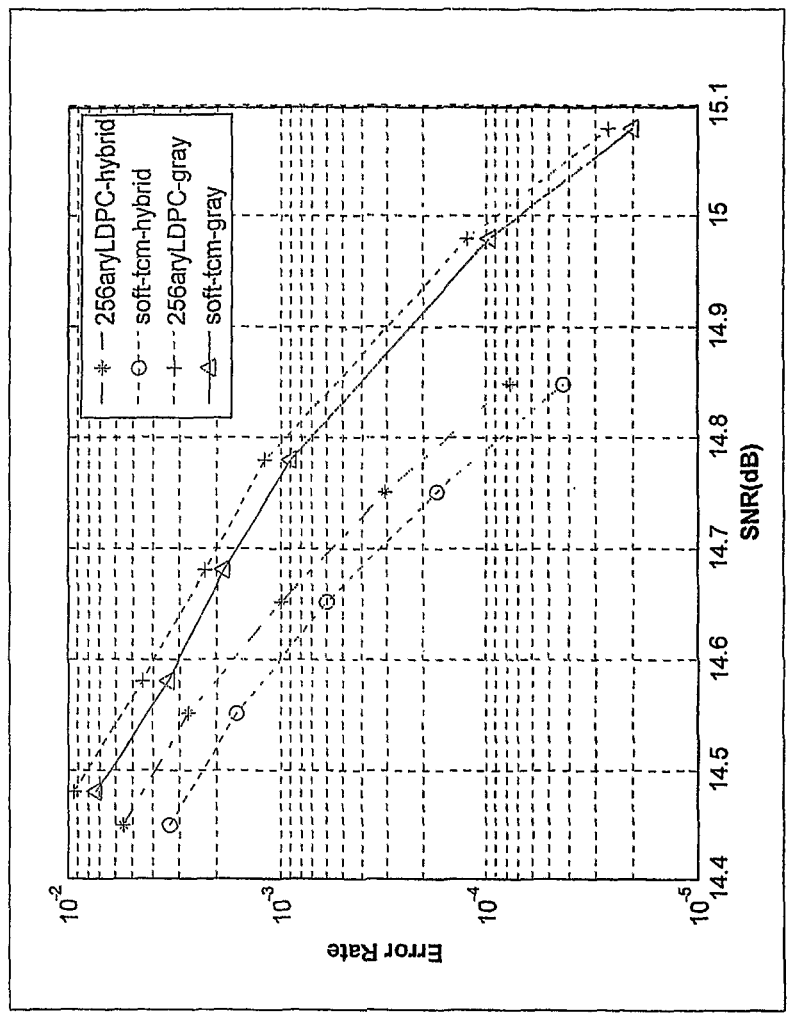
Figure 3. Exemplary peformance comparison between hybrid criteria and gray criteria

US 8,793,551 B2

SERIAL CONCATENATION OF TRELLIS CODED MODULATION AND AN INNER NON-BINARY LDPC CODE

This application claims the benefit, under 35 U.S.C. §365 of International Application PCT/IB2009/006041, filed June 24, 2009, which was published in accordance with PCT Article 21(2) on Dec. 30, 2009 in English and which claims the benefit of European patent application No. 08305322.3, filed Jun. 25, 2008.

FIELD OF THE INVENTION

The present invention generally relates to communications systems and, more particularly, to modulated systems, e.g., terrestrial broadcast, cellular, Wireless-Fidelity (Wi-Fi), satellite, and other systems that can benefit from error correction.

BACKGROUND OF THE INVENTION

Previous coded modulation in digital video broadcasting transmission mainly comprised a combination of binary channel coding with non-binary modulation. Concatenated encoders employing an inner coding block residing near the transmission channel and an outer coding block residing near the data input are known in the art. Some concatenated encoders have also used interleaving devices between the inner and outer coding blocks to mitigate the effects of burst errors in the transmission channel. A block code such as a Reed-Solomon code is generally used as an outer code while codes such as Trellis Coded Modulation are usually used as an inner code. Binary Low Density Parity Check codes have also been used as inner codes with the outer code being either Reed-Solomon or BCH coding.

In the European DVB-T standard for terrestrial broadcast, a concatenated channel coding scheme is applied. It uses Reed-Solomon (RS) code (204,188) as an outer code, and a convolutional code as an inner code. A convolutional interleaver positioned between the outer and inner code elements is used to reduce the effects of long sequences of channel errors. In the United States the terrestrial broadcast standard employs an eight level vestigial side band (8-VSB) modulation technique. This technique also uses a concatenated scheme that features RS (207,187) as an outer code with Trellis Coded 8-Level Vestigial Side-Band (8-VSB) modulation. Again, a convolutional interleaver is positioned between the outer and inner code elements. The ISDB Japanese broadcast standard has a channel coding scheme that is similar to that of DVB-T.

Binary coding is well suited for binary modulation. Because of increased channel capacity requirements, non binary quadrature amplitude modulations, such as 16QAM, 64QAM, and 256QAM, have been used in digital video broadcasting transmission systems. When binary channel coding is used with non-binary memoryless modulation, bit-streams must be mapped into symbols before modulation at the transmitter side. Similarly, on the receiver side, conversion of modulation symbol likelihoods into code bit probabilities is needed before decoding decisions can be made.

Standard theoretical analysis shows that a significant loss in performance may be caused by bit-to-symbol and symbol-to-bit conversions. To get better performance, binary extrinsic probabilities generated by the channel decoder are fed back to the de-mapping section in order to close the iterative detection/decoding loop on the receiver side. On the other hand, when the channel code alphabet is matched to the modulation alphabet, the channel likelihoods are directly processed by the decoder without any information loss, and there is no need to iterate between demodulation and decoding.

Binary Low Density Parity Check (LDPC) codes are recognized as capacity approaching codes for various types of channels when the size of the codeword tends to infinity. However, there are circumstances under which the limitations of binary LDPC codes have a negative effect on performance. Using small or moderate block lengths or combining binary LDPC coding with non binary modulation highlight the limitations of binary LDPC coding.

One of the goals of the invention is to overcome the problems encountered when small or medium block lengths are used. Another goal is to reduce the problems encountered while using binary LDPC coding as described.

Trellis coded modulation (TCM) is known to increase the Euclidean distance between symbols in a constellation. In prior art TCM systems the constellation that is generated is directly applied to an in (I) phase and a quadrature (Q) phase IQ modulator for application to a transmission channel.

SUMMARY OF THE INVENTION

In accordance with the present invention it is recognized that non-binary low density parity check (LDPC) encoding mapped to high order modulation systems using a gray mapping criteria results in improved error performance over a communications channel when data has been trellis code modulated (TCM) using non gray criteria for set partition mapping. An interleaving block placed between the TCM block and non-binary LDPC block improves burst error performance and therefore overall performance.

BRIEF DESCRIPTION OF THE DRAWINGS

FIG. 1. An exemplary block diagram as per the invention.
FIG. 1a. An exemplary flow chart according to the invention.
FIG. 2. Exemplary simulation results of TCM.
FIG. 3. Exemplary simulation results comparing hybrid and gray criteria.

DETAILED DESCRIPTION

An exemplary system block diagram (100) of a combined transmit and receive system according to the invention is shown in FIG. 1. A data source (101) supplies a digital data sequence to a trellis coded modulation (TCM) block (102) whose purpose is to generate a 256 QAM symbol constellation using non-Gray code set partition mapping. A symbol interleaving block (103) receives the symbol stream output of the TCM block (102) and re-orders the symbols to separate adjacent symbols to improve burst error performance through the transmission channel. The integer values of the symbols output from the interleaving block (103) are input to a non-binary 256-ary low density parity check (LDPC) encoder (104). The LDPC encoder (104) assigns the integer values as message bits to particular variable nodes and generates parity bit assignments for the check nodes according to a parity check matrix. The non-binary LDPC encoder (104) output is Gray code mapped to a transmission channel constellation by the Mapping block (105). The combination of non-gray code set partitioning at the TCM and Gray code mapping of the LDPC encoder output is herein referred to as hybrid criteria. A modulator, not shown in FIG. 1, is used to modify a carrier signal and apply this signal to a transmission channel (106). The signal traverses a transmission channel (106) to a receiver containing a demodulator, not shown in FIG. 1, that receives the modified carrier signal and recovers the constellation of transmitted symbols. A de-mapping block (107) reverses the mapping function performed at the transmit side to output a non-binary LDPC encoded signal. This non-binary LDPC encoded signal is applied to the 256-ary LDPC decoder (108) which decodes the signal into interleaved trellis coded integer values of symbols. The symbol de-interleaver (109) returns the integer values to symbols in their original order for application to the TCM 256QAM decoder (110). The TCM 256QAM decoder (110) recovers the original sequence of digital data.

TCM encoder uses convolutional coding to create redundant information that achieves coding gain without bandwidth expansion. This is accomplished by increasing the constellation size to accommodate the redundant information while maintaining the symbol transmission rate. In the present invention, non-Gray set partition mapping criteria is advantageously used to assign bit structures to constellation symbols in a manner that increases the Euclidean distance between symbols. In the present invention trellis code modulation is performed on the input data to provide error protection but the constellation symbols generated are not applied directly to an IQ modulator as is done in the prior art. The output symbols of the TCM encoder block (102) proceed through additional concatenated processing before the resulting information is modulated on a transmission channel.

An exemplary flow chart (200) according to the invention is shown in FIG. 1a. Data encoding step (201) performs trellis coded modulation to generate symbols that have been non-Gray code mapped. The TCM symbols are interleaved by TCM Symbol Interleaving step (202). The interleaved symbols are Low Density Parity Check encoded by LDPC Encoding step (203) which is followed by Gray code Constellation mapping step (204) which maps the signal to the transmission constellation. A Modulating step (205) prepares the signal for transmission. Transmitting step (206) carries the modulated signal from the transmitter side, comprising steps 201, 202, 203, 204, and 205, to the receiving side, comprising steps 207, 208, 209, 210, 211, and 212. At the receiver, Demodulating to Recover Symbols step (207) is followed by Gray code Demapping and Converting Symbols to non-binary LDPC coded signals step (208). The LDPC coded signal is decoded by step 209 to recover error corrected interleaved trellis coded symbols. Deinterleaving trellis coded symbols step (210) returns the TCM symbols to their pre-interleave order. A demodulating step (211) using non-Gray code demapping performs trellis code demodulation and passes the output to step 212 where error corrected data is determined.

The present invention uniquely utilizes non-binary low density parity check code as an inner block residing near the transmission channel and trellis coded modulation as an outer block residing near the data input in a concatenated encoder with interleaving between the two blocks. Since binary low density parity check (LDPC) codes mapped to high order modulation constellations yields lower than desired performance, non-binary LDPC codes are mapped to high order constellations in the present invention. Using non-binary LDPC codes permits direct mapping of the channel code alphabet to the modulation alphabet. Performance losses due to bit to symbol conversion at the transmitter side of a binary LDPC encoder and symbol to bit conversions at a binary LDPC decoder on the receiver side are eliminated through the use of the non-binary LDPC encoding/decoding system.

Non-binary LDPC decoders are capable of making hard or soft decisions regarding the decoded values. Performance results for the described system shown in FIG. 2 show an improvement in bit error rate using soft decision data over hard decision data supplied by the LDPC decoder. In FIG. 2 the error rate at the output of the LDPC decoder is labeled 256 ary LDPC. The error rate at the output of the trellis coded demodulator is labeled hard-TOM indicating that LDPC decoder produced output using hard decisions. The error rate using soft decisions is labeled soft-TOM.

A comparison of error rate results using only gray criteria and using the inventive hybrid criteria described is shown in FIG. 3. The error results using the invention are labeled hybrid and the prior art results are labeled gray. As can be seen from FIG. 3, the error performance of the hybrid criteria has more than 0.25 dB of gain than that of the gray criteria.

In one embodiment, a receiver apparatus includes a demodulator for recovering transmitted symbols, a Gray code de-mapper for converting the recovered symbols to non-binary LDPC coded signals, a non-binary LDPC decoder for recovering error corrected interleaved symbols from the non-binary LDPC coded signals, a deinterleaver for returning the interleaved symbols to pre-interleave order, and a non-Gray code de-mapped trellis coded demodulator for recovering error corrected data from the deinterleaved symbols. Optionally, the non-binary LDPC decoder can be one of 4-ary LDPC, 8-ary LDPC, 16-ary LDPC, 64-ary LDPC, 128-ary LDPC and 256-ary LDPC decoders. Optionally, the symbol constellation of the trellis coded demodulator can be one of a 4-QAM, 8-QAM, 16-QAM, 64-QAM, 128-QAM and 256-QAM symbol constellation.

In one embodiment, a method performed by a receiver apparatus includes demodulating a carrier signal to recover transmitted symbols, converting the demodulated symbols to a non-binary LDPC coded signal using Gray code demapping, decoding the non-binary LDPC coded signal to recover error corrected interleaved trellis coded symbols, deinterleaving the trellis coded symbols to pre-interleave order, demodulating the deinterleaved trellis coded symbols using non-Gray code demapping, and determining error corrected data. Optionally, the step of demodulating the deinterleaved trellis coded symbols can include demodulating one of a 4-QAM, 8-QAM, 16-QAM, 64-QAM, 128-QAM or a 256-QAM symbol constellation. Optionally, the non-binary LDPC coded signal in the decoding step can be one of a 4-ary LDPC, 8-ary LDPC, 16-ary LDPC, 64-ary LDPC, 128-ary LDPC or a 256-ary LDPC non-binary coded signal.

In one embodiment, a transmitter apparatus includes a data source, a trellis coded modulator for mapping and trellis encoding data into non-Gray code mapped trellis encoded symbols, a symbol interleaver for time reordering the non-Gray code mapped trellis encoded symbols, a non-binary LDPC encoder for encoding the interleaved symbols, a Gray code constellation mapper for mapping the LDPC coded symbols to a transmission constellation, and a modulator for applying a signal to a transmission channel. Optionally, a symbol constellation of the trellis coded modulator can be one of a 4-QAM, 8-QAM, 16-QAM, 64-QAM, 128-QAM or a 256-QAM symbol constellation. Optionally, the non-binary LDPC encoder can be one of a 4-ary LDPC, 8-ary LDPC, 16-ary LDPC, 64-ary LDPC, 128-ary LDPC or a 256-ary LDPC non-binary encoder.

In one embodiment, a transmitter method includes encoding data using non-Gray coded symbol mapping to form trellis coded modulation symbols, interleaving the trellis coded modulation symbols to time reorder the symbols, encoding the interleaved trellis coded modulation symbols using a non-binary LDPC encoder, and mapping an output of the non-binary LDPC encoder to a transmission constellation using a Gray code constellation map. Optionally, a symbol constellation of the trellis coded modulation can be one of 4-QAM, 8-QAM, 16-QAM, 64-QAM, 128-QAM and 256-QAM symbol constellation. Optionally, the non-binary LDPC encoder can be one of a 4-ary LDPC, 8-ary LDPC, 16-ary LDPC, 64-ary LDPC, 128-ary LDPC or 256-ary LDPC non-binary encoder.

The implementations described herein may be implemented in, for example, a method or process, an apparatus, or a software program. Even if only discussed in the context of a single form of implementation (for example, discussed only as a method), the implementation of features discussed may also be implemented in other forms (for example, an apparatus or program). An apparatus may be implemented in, for example, appropriate hardware, software, and firmware. The methods may be implemented in, for example, an apparatus such as, for example, a processor, which refers to processing devices in general, including, for example, a computer, a microprocessor, an integrated circuit, or a programmable logic device. Processing devices also include communication devices, such as, for example, computers, cell phones, portable/personal digital assistants ("PDAs"), and other devices that facilitate communication of information between end-users.

Implementations of the various processes and features described herein may be embodied in a variety of different equipment or applications, particularly, for example, equipment or applications associated with data transmission and reception. Examples of equipment include video coders, video decoders, video codecs, web servers, set-top boxes, laptops, personal computers, and other communication devices. As should be clear, the equipment may be mobile and even installed in a mobile vehicle.

Additionally, the methods may be implemented by instructions being performed by a processor, and such instructions may be stored on a processor-readable medium such as, for example, an integrated circuit, a software carrier or other storage device such as, for example, a hard disk, a compact diskette, a random access memory ("RAM"), or a read-only memory ("ROM"). The instructions may form an application program tangibly embodied on a processor-readable medium. As should be clear, a processor may include a processor-readable medium having, for example, instructions for carrying out a process.

As should be evident to one of skill in the art, implementations may also produce a signal formatted to carry information that may be, for example, stored or transmitted. The information may include, for example, instructions for performing a method, or data produced by one of the described implementations. Such a signal may be formatted, for example, as an electromagnetic wave (for example, using a radio frequency portion of spectrum) or as a baseband signal. The formatting may include, for example, encoding a data stream, packetizing the encoded stream, and modulating a carrier with the packetized stream. The information that the signal carries may be, for example, analog or digital information. The signal may be transmitted over a variety of different wired or wireless links, as is known.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are within the scope of the following claims.

The invention claimed is:

1. A receiver apparatus comprising:
a demodulator for recovering transmitted symbols;
a Gray code de-mapper for converting the recovered symbols to non-binary LDPC coded signals;
a non-binary LDPC decoder for recovering error corrected interleaved symbols from the non-binary LDPC coded signals;
a deinterleaver for returning the interleaved symbols to pre-interleave order; and
a non-Gray code de-mapped trellis coded demodulator for recovering error corrected data from the deinterleaved symbols.

2. The receiver apparatus of claim 1, wherein:
the non-binary LDPC decoder is one of 4-ary LDPC, 8-ary LDPC, 16-ary LDPC, 64-ary LDPC, 128-ary LDPC and 256-ary LDPC decoders.

3. The receiver apparatus of claim 1, wherein:
the symbol constellation of the trellis coded demodulator is one of 4-QAM, 8-QAM, 16-QAM, 64-QAM, 128-QAM and 256-QAM.

4. The receiver apparatus of claim 1, wherein:
the output of the non-binary LDPC decoder is based upon soft decisions.

5. A receiver method comprising:
demodulating a carrier signal to recover transmitted symbols;
converting the demodulated symbols to a non-binary LDPC coded signal using Gray code demapping;
decoding the non-binary LDPC coded signal to recover error corrected interleaved trellis coded symbols;
deinterleaving the trellis coded symbols to pre-interleave order;
demodulating the deinterleaved trellis coded symbols using non-Gray code demapping; and
determining error corrected data.

6. The receiver method of claim 5, wherein the step of demodulating the deinterleaved trellis coded symbols comprises demodulating one of a group consisting of 4-QAM, 8-QAM, 16-QAM, 64-QAM, 128-QAM and 256-QAM symbol constellations.

7. The receiver method of claim 5, wherein:
the non-binary LDPC coded signal in the decoding step is one of a group consisting of 4-ary LDPC, 8-ary LDPC, 16-ary LDPC, 64-ary LDPC, 128-ary LDPC and 256-ary LDPC non-binary coded signals.

8. The receiver method of claim 5, wherein:
the decoding non-binary LDPC coded signals is based upon soft decisions.

9. A transmitter apparatus comprising:
a data source;
a trellis coded modulator for mapping and trellis encoding data into non-Gray code mapped trellis encoded symbols;
a symbol interleaver for time reordering the non-Gray code mapped trellis encoded symbols;
a non-binary LDPC encoder for encoding the interleaved symbols,
a Gray code constellation mapper for mapping the LDPC coded symbols to a transmission constellation; and
a modulator for applying a signal to a transmission channel.

10. The transmitter apparatus of claim 9, wherein:
a symbol constellation of the trellis coded modulator is one of a group consisting of 4-QAM, 8-QAM, 16-QAM, 64-QAM, 128-QAM and 256-QAM symbol constellations.

11. The transmitter apparatus of claim 9, wherein:
the non-binary LDPC encoder is one of a group consisting of 4-ary LDPC, 8-ary LDPC, 16-ary LDPC, 64-ary LDPC, 128-ary LDPC and 256-ary LDPC non-binary encoders.

12. A transmitter method comprising;
encoding data using non-Gray coded symbol mapping to form trellis coded modulation symbols;
interleaving the trellis coded modulation symbols to time reorder the symbols;
encoding the interleaved trellis coded modulation symbols using a non-binary LDPC encoder;
mapping an output of the non-binary LDPC encoder to a transmission constellation using a Gray code constellation map; and
applying the mapped output to a transmission channel using a modulator.

13. The transmitter method of claim 12, wherein:
a symbol constellation of the trellis coded modulation is one of a group consisting of 4-QAM, 8-QAM, 16-QAM, 64-QAM, 128-QAM and 256-QAM symbol constellations.

14. The transmitter method of claim 12, wherein:
the non-binary LDPC encoder is one of a group consisting of 4-ary LDPC, 8-ary LDPC, 16-ary LDPC, 64-ary LDPC, 128-ary LDPC and 256-ary LDPC non-binary encoders.

* * * * *